(12) United States Patent
Hwang

(10) Patent No.: US 6,995,499 B2
(45) Date of Patent: Feb. 7, 2006

(54) MICRO PIEZOELECTRIC ACTUATOR AND METHOD FOR FABRICATING SAME

(75) Inventor: Kyu-Ho Hwang, Seoul (KR)

(73) Assignee: M2N Inc., Seoul (KR)

( * ) Notice: Subject to any disclaimer, the term of this patent is extended or adjusted under 35 U.S.C. 154(b) by 155 days.

(21) Appl. No.: 10/450,719

(22) PCT Filed: Apr. 17, 2002

(86) PCT No.: PCT/KR02/00701

§ 371 (c)(1),
(2), (4) Date: Jun. 25, 2003

(87) PCT Pub. No.: WO02/084753

PCT Pub. Date: Oct. 24, 2002

(65) Prior Publication Data

US 2004/0061417 A1    Apr. 1, 2004

(30) Foreign Application Priority Data

Apr. 17, 2001 (KR) ............... PCT/KR01/00632

(51) Int. Cl.
- *H01L 41/08* (2006.01)
- *G02F 1/00* (2006.01)
- *G02B 26/08* (2006.01)

(52) U.S. Cl. .............. 310/328; 310/331; 359/223; 185/14

(58) Field of Classification Search ........... 310/324, 310/328, 330–332; 359/223, 224, 291; 385/14–16, 385/18
See application file for complete search history.

(56) References Cited

U.S. PATENT DOCUMENTS

| | | | |
|---|---|---|---|
| 5,116,131 A | 5/1992 | Farahani et al. | |
| 5,208,880 A | 5/1993 | Riza et al. | |
| 5,959,760 A | 9/1999 | Yamada et al. | |
| 5,969,848 A | 10/1999 | Lee et al. | |
| 6,201,629 B1 * | 3/2001 | McClelland et al. | 359/223 |
| 6,353,492 B2 * | 3/2002 | McClelland et al. | 359/254 |
| 6,515,791 B1 * | 2/2003 | Hawwa et al. | 359/323 |
| 6,665,476 B2 * | 12/2003 | Braun et al. | 385/50 |
| 6,668,109 B2 * | 12/2003 | Nahum et al. | 385/18 |
| 6,785,437 B2 * | 8/2004 | Hagood et al. | 385/16 |
| 6,813,054 B2 * | 11/2004 | Aksyuk et al. | 359/224 |
| 2001/0036333 A1 | 11/2001 | Kasuga et al. | |
| 2002/0008922 A1 | 1/2002 | Conant et al. | |

FOREIGN PATENT DOCUMENTS

| | | |
|---|---|---|
| WO | 00/57233 A2 | 9/2000 |
| WO | 01/76055 A2 | 10/2001 |

* cited by examiner

*Primary Examiner*—Mark Budd
(74) *Attorney, Agent, or Firm*—Bacon & Thomas

(57) ABSTRACT

There is provided a micro piezoelectric actuator, an optical switching device including the micro piezoelectric actuator and a method for fabricating the same. The optical switching device includes a mirror, a first actuator for adjusting the tilt angle of the mirror on the X axis, a second actuator for adjusting the tilt angles of the mirror and the first actuator on the Y axis and a driving substrate for applying a driving signal to the first and second actuators. Each of the actuators has membranes, a piezoelectric device formed on each of the membranes and a connecting part having two elastic bodies coupled to the membranes and a connecting member coupled between the two elastic bodies. In this way, the optical switching device can tilt the mirror on the X axis independently from the tilting thereof on the Y axis.

15 Claims, 14 Drawing Sheets

MICRO PIEZOELECTRIC ACTUATOR AND METHOD FOR FABRICATING SAME

FIELD OF THE INVENTION

The present invention relates to a micro actuator and a method for fabricating same, and, also, to an optical switching device using the micro actuator and a method for fabricating same. The micro actuator is employed in an optical variable attenuator, an optical cross connect, a display device, a micro array, a micro motor, a micro step motor, a scanner, etc.

BACKGROUND OF THE INVENTION

In an optical communications system, an optical switch performs an O-E-O (optical-electrical-optical) conversion where an optical signal is converted into an electrical signal to be switched at an electrical level and then is reconverted into another optical signal. However, the O-E-O conversion is a very complicated process since it requires 3R (retiming, reshaping and regeneration) of the signal. Further, since employed in this O-E-O switching mechanism is a WDM (wavelength division multiplexing) technique whereby a plurality of lights having different wave lengths are transmitted through only one optical fiber port, a transmission velocity is limited to a very small range.

A switching device plays an important role in a modern communications system, and one among the most important techniques required in such a switching device is a switching technique that determines a maximum capacity of a switching system. It is expected that every subscriber will use a bandwidth ranging from several hundreds of Mbps to several tens of Gbps in a next generation communications network. In order to increase the switching capacity, two methods may be employed: one is to increase a speed of the conventional electrical switch and the other is to use a new component, i.e., an optical switch. However, the former has many defects. For example, a time delay cannot be avoided since the electrical switch involves two conversion processes in which an optical signal is first converted into an electrical signal and, then, the electrical signal is reconverted into another optical signal to be transmitted through a selected transmission channel. Furthermore, since the electrical switch has a very complicated structure, manufacturing costs are increased. In the meanwhile, in order to obtain competitiveness in terms of price, the switching device is required to be further scaled down. Thus, considering the above-described drawbacks of the electrical switch and the recent trend for the more miniaturized switching device, attentions are directed to an optical switch that is capable of obtaining high capacity and competitiveness in price without involving an O-E-O conversion.

For this reason, a switching technique using a micro mirror controlled by using a MEMS (micro electro-mechanical systems) type actuator is gaining popularity in recent years. This type of optical switch using the micro-mirror can accommodate more than 256 ports therein and, thus, is expected to be widely utilized in developing an optical module for use in an OXC (optical cross connect) system.

As mentioned above, the optical switch is implemented by using the MEMS. The MEMS refers to a 3-D microstructure fabrication technique branched from a semiconductor processing technology. To be more specific, the MEMS is employed to fabricate macroscopic mechanical elements to have a micron or nano size. By using the MEMS technique, not only a simple mechanical structure but also a variety of intelligent micro systems can be fabricated by integrating a micro sensor, an actuator, etc., with a logic circuit. Accordingly, the MEMS has a wide range of applications: communications systems, a military industry, a medical instrument manufacturing, aeronautical engineering, etc. Particularly, the optical switch is given a great attention in the field of optical communication since it is expected to be fabricated by using the MEMS technology to be available in the near further.

Optical switches known so far are technically classified into two types according to their optical channel switching methods: one is a type using a micro mirror and the other is a type using a refraction index of a micro fluid.

The optical switch using the micro mirror is divided into a 2D planar switch having a two-dimensional array and a 3D free-spatial switch having a three-dimensional array. Though the 2D switch has many advantages in that it allows optical fibers to be readily arranged and has a simple structure due to its employment of an on-off operation type mirror, the 2D switch cannot be fabricated to accommodate therein 32×32 or more ports. Thus, the 3D switch that shows a greater expandability is more adequate for use in a backbone network requiring Tbps level capacity.

In general, actuators used in the micro device such as the above-described optical switch has been fabricated by using electrostatic force. However, the actuator using electrostatic has disadvantage in that it accompanies an increase of a driving voltage, e.g., more than 200V, and it has non-linear characteristics. Also, it is not preferable since a pull-in phenomenon of a micro mirror being adhered to a substrate occurs. Furthermore, it is difficult to obtain a large displacement angle of the mirror and precisely control an optical channel by revolving the micro mirror with respect to two axes, e.g., a X and a Y axis.

SUMMARY OF THE INVENTION

It is, therefore, an object of the present invention to provide a closed loop shaped actuator for allowing a displacement angle of a micro mirror to be increased.

It is another object of the present invention to provide a closed loop shaped actuator capable of preventing a coupling of two axes where the micro mirror operates, and an optical switching device using the closed loop shaped actuator.

In accordance with one aspect of the present invention, there is provided a micro actuator comprising: a first membrane; a second membrane; a piezoelectric device formed on at least one of the first and second membranes; a first connecting part including a first elastic body coupled to the first membrane, a second elastic body coupled to the second membrane and a first connecting member coupled between the first and second elastic bodies; and a second connecting part including a third elastic body coupled to the first membrane, a fourth elastic body coupled to the second membrane and a second connecting member coupled between the third and fourth elastic bodies.

In accordance with another aspect of the present invention, there is provided an optical switching device comprising: a first actuator including a first membrane, a second membrane, a piezoelectric device formed on at least one of the first and second membranes, a first connecting part and a second connecting part, wherein the first connecting part includes a first elastic body coupled to the first membrane, a second elastic body coupled to the second membrane and a first connecting member coupled between the first and second elastic bodies, and the second connecting part includes a third elastic body coupled to the first membrane, a fourth elastic body coupled to the second membrane and a second connecting member coupled between the third and fourth elastic bodies; a second actuator including a third membrane, a fourth membrane, a piezoelectric device formed on at least one of the third and fourth membranes, a third connecting part and a fourth connecting part, wherein the third connecting part includes a fifth elastic body coupled to the third membrane, a sixth elastic body coupled to the fourth membrane and a third connecting member coupled between the fifth and sixth elastic bodies, and the fourth connecting part includes a seventh elastic body coupled to the third membrane, a eighth elastic body coupled to the fourth membrane and a fourth connecting member coupled between the seventh and eighth elastic bodies; and a mirror positioned inside the first actuator, wherein the mirror is coupled to the first actuator through a first transmitting part and the first actuator is coupled to the second actuator through a second transmitting part.

In accordance with still another aspect of the present invention, there is provided an optical switching device array having M×N array of optical switching devices, wherein each of M and N is a positive integer and each of the optical switching devices comprises: a first actuator including a first membrane, a second membrane, a piezoelectric device formed on at least one of the first and second membranes, a first connecting part and a second connecting part, wherein the first connecting part includes a first elastic body coupled to the first membrane, a second elastic body coupled to the second membrane and a first connecting member coupled between the first and second elastic bodies, and the second connecting part includes a third elastic body coupled to the first membrane, a fourth elastic body coupled to the second membrane and a second connecting member coupled between the third and fourth elastic bodies; a second actuator including a third membrane, a fourth membrane, a piezoelectric device formed on at least one of the third and fourth membranes, a third connecting part and a fourth connecting part, wherein the third connecting part includes a fifth elastic body coupled to the third membrane, a sixth elastic body coupled to the fourth membrane and a third connecting member coupled between the fifth and sixth elastic bodies, and the fourth connecting part includes a seventh elastic body coupled to the third membrane, a eighth elastic body coupled to the fourth membrane and a fourth connecting member coupled between the seventh and eighth elastic bodies; and a mirror positioned inside the first actuator, wherein the mirror is coupled to the first actuator through a first transmitting part and the first actuator is coupled to the second actuator through a second transmitting part.

In accordance with still another aspect of the present invention, there is provided a method for fabricating a micro actuator, the method comprising the steps of: forming a driving substrate having a driving circuit for generating a driving signal; applying a protection layer on the upper surface of the driving substrate; applying a sacrificial layer on the upper surface of the protection layer; etching the sacrificial layer whereby forming columns for supporting connecting parts; applying a membrane layer on the upper surfaces of the protection layer and the columns; forming a piezoelectric device on the upper surface of the membrane layer, the piezoelectric device having a bottom electrode, a piezoelectric material and a top electrode; and patterning the membrane layer whereby membranes and connecting parts are formed on the columns, each of the connecting parts having two inclines and a connecting member coupled between the two inclines.

In accordance with still another aspect of the present invention, there is provided a method for fabricating an optical switching device, the method comprising the steps of: forming a driving substrate having a driving circuit for generating a driving signal; applying a protection layer on the upper surface of the driving substrate; applying a sacrificial layer on the upper surface of the protection layer; etching the sacrificial layer whereby forming columns for supporting connecting parts; applying an membrane layer on the upper surface of the protection layer; forming a piezoelectric device on the upper surface of the membrane layer, the piezoelectric device having a bottom electrode, a piezoelectric material and a top electrode; patterning the membrane layer such that a first actuator and a second actuator are formed therein wherein each of the first and second actuators includes membranes and connecting parts, each of the connecting parts having two inclines and a connecting member coupled between the two inclines; patterning the membrane layer such that a first transmitting part and a second transmitting part are formed therein, the first transmitting part connecting the first actuator to a mirror and the second transmitting part connecting the second actuator to the first actuator; applying a mirror on the membrane layer, the mirror being positioned inside the first actuator; forming a passivation layer on the optical switching device; removing the driving substrate facing the underlying surfaces of the mirror and the first and second actuators; and removing the passivation layer and the protection layer.

In accordance with still another aspect of the present invention, there is provided a method for fabricating a micro actuator, the method comprising the steps of: forming a driving substrate having a driving circuit for generating a driving signal; applying a protection layer on the upper surface of the driving substrate; applying a membrane layer on the upper surface of the protection layer; forming a piezoelectric device on the upper surface of the membrane layer, the piezoelectric device having a bottom electrode, a piezoelectric material and a top electrode; and patterning the membrane layer whereby membranes and connecting parts are formed thereon, each of the connecting parts having two elastic bodies and a connecting member coupled between the two elastic bodies.

In accordance with still another aspect of the present invention, there is provided a method for fabricating an optical switching device, the method comprising the steps of: forming a driving substrate having a driving circuit for generating a driving signal; applying a protection layer on the upper surface of the driving substrate; applying an membrane layer on the upper surface of the protection layer; forming a piezoelectric device on the upper surface of the membrane layer, the piezoelectric device having a bottom electrode, a piezoelectric material and a top electrode; patterning the membrane layer such that a first actuator and a second actuator are formed therein wherein each of the first and second actuators includes membranes and connecting parts, each of the connecting parts having two elastic bodies and a connecting member coupled between the two elastic bodies; patterning the membrane layer such that a first transmitting part and a second transmitting part are formed therein, the first transmitting part connecting the first actuator to a mirror and the second transmitting part connecting the second actuator to the first actuator; applying a mirror on the membrane layer, the mirror being positioned inside the first actuator; forming a passivation layer on the optical switching device; removing the driving substrate facing the underlying surfaces of the mirror and the first and second actuators; and removing the passivation layer and the protection layer.

BRIEF DESCRIPTION OF THE INVENTION

The above and other objects and features of the present invention will become apparent from the following description of preferred embodiments given in conjunction with the accompanying drawings, in which:

FIG. 1 provides a cross-sectional view of an optical switching device for use in describing a basic concept of the present invention;

FIGS. 2A and 2B respectively offer a schematic view describing an operation of the optical switching device shown in FIG. 1;

Figure 5:
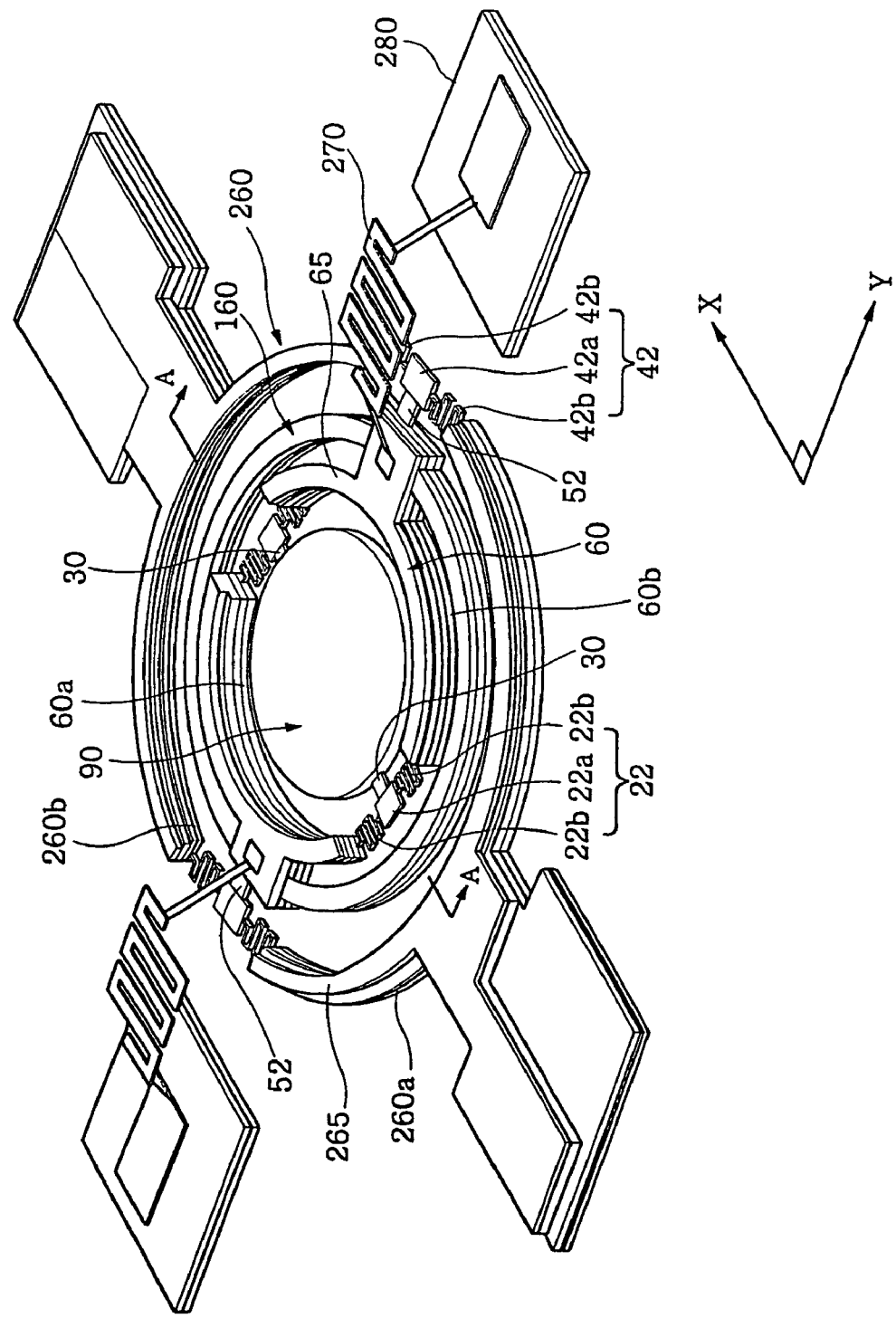
FIG. 5 shows a perspective view of an optical switching device having an actuator in accordance with another preferred embodiment of the present invention.
Figure 6A:
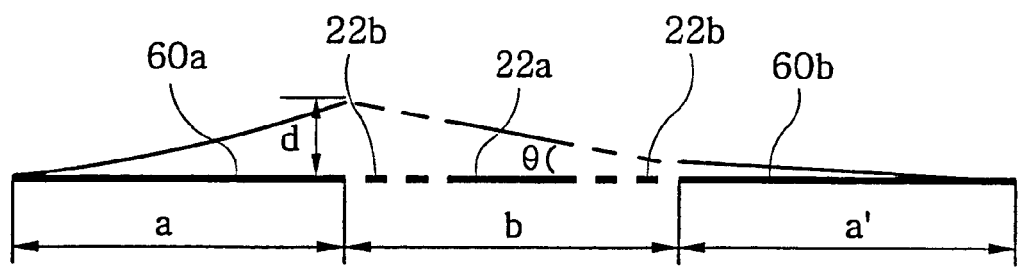
Figure 6B:
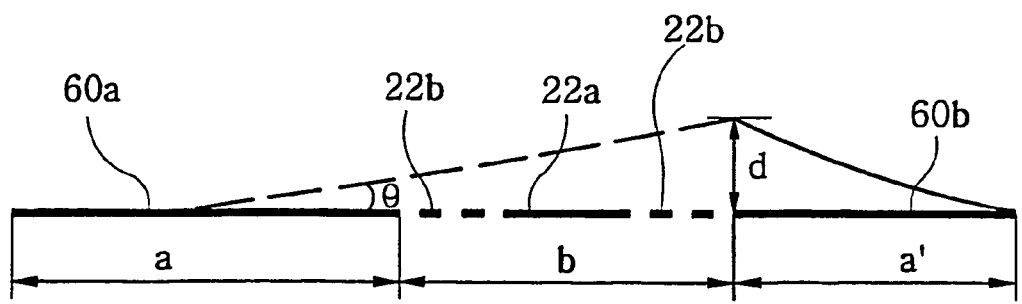

FIGS. 6A and 6B respectively set forth a schematic view for describing an operation of the optical switching device shown in FIG. 5; and FIGS. 7A to 7L describe a process for fabricating the optical switching device in accordance with the another preferred embodiment of the present invention.

DESCRIPTION OF SPECIFIC EMBODIMENTS

Figure 1:
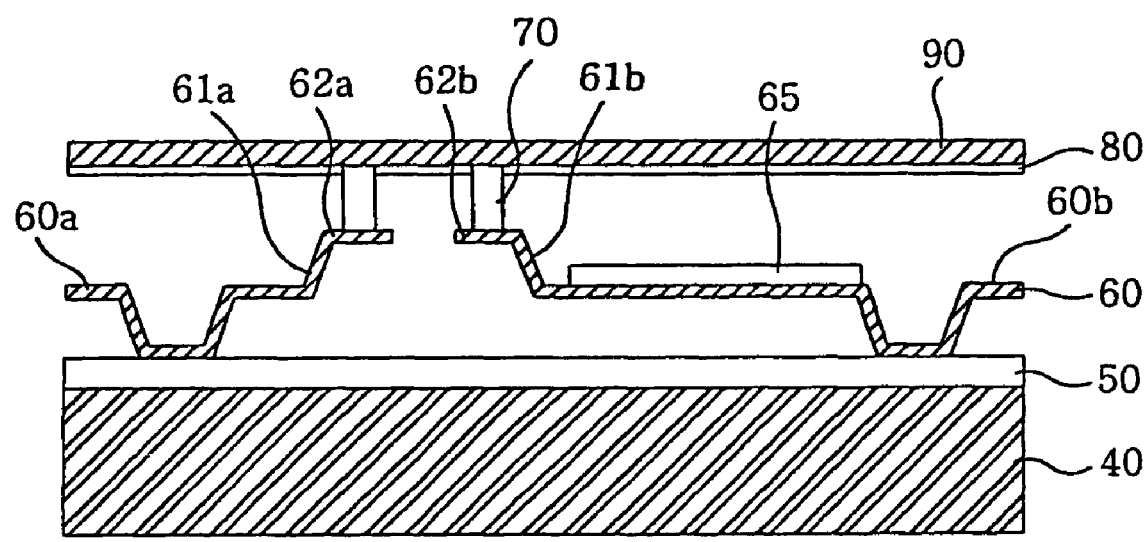

Referring to FIG. 1, there is provided a cross-sectional view of an optical switching device for use in describing a basic concept of the present invention. Though an actuator used in the optical switching device is illustrated to have a linear structure in FIG. 1, the present invention is directed to an actuator having a closed loop shape, which is a modification of the actuator in FIG. 1.

The actuator of the optical switching device shown in FIG. 1 includes a first membrane 60a, a second membrane 60b and a piezoelectric device 65 disposed on at lease one of the first and the second membranes 60a and 60b. The actuator further includes connecting parts for coupling the first and the second membranes 60a and 60b. Each of the connecting parts has a first elastic body 61a connected to the first membrane 60a, a second elastic body 61b connected to the second membrane 60b, a first connecting member 62a connected to the first elastic body 61a and a second connecting member 62b connected to the second elastic body 61b.

Though the first connecting member 62a and the second connecting member 62b are separated from each other in FIG. 1, it is possible to connect the first and the second membrane 62a and 62b in case a mirror, to be described later, need not have 2-axis movements.

In the meantime, the first and second elastic bodies 61a and 61b are inclined with respect to the membranes and the connection members. In this case, an angle formed where the elastic body and the membrane cross is equal to or larger than 90°. Further, it is preferable to connect the elastic body and the membrane in a manner that the elastic body is circularly movable along with the membrane.

Though the piezoelectric device 65 is described to have one layer in FIG. 1 for the sake of simplicity, the piezoelectric device 65 actually has a top electrode, a bottom electrode and a piezoelectric material disposed between the first and the second electrodes. Herein, the piezoelectric material contains, e.g., PZT, $PbTiO_3$, PLZT, $PbZrO_3$, PLT, PNZT, $LiNbO_3$ or $LiTaO_3$.

Figure 2A:
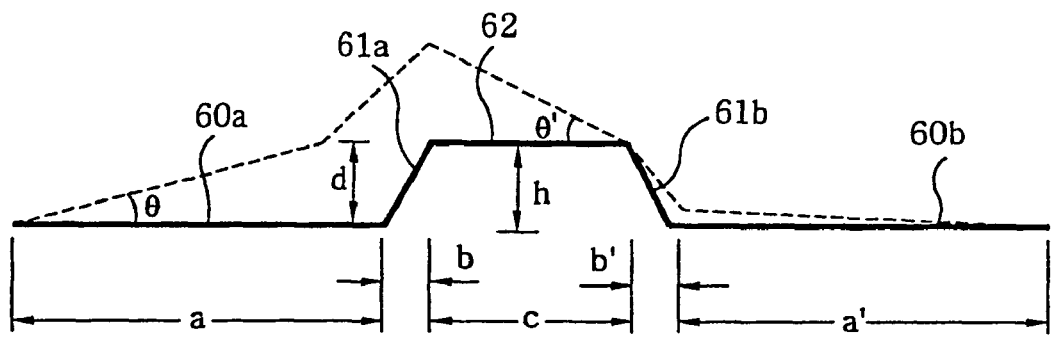

Referring to FIG. 2A, there is provided a schematic view describing an operation of a linear type actuator whose technical concept is the same as that of the present invention. Herein, the first connecting member 62a and the second connecting member 62b are not separated but is formed as one body (a connecting member 62).

The essence of the present invention resides in the structure of the connecting part for coupling the first membrane 60a and the second membrane 60b. The connecting part shown in FIG. 2A includes the first elastic body 61a, the second elastic body 61b and the connecting member 62. The piezoelectric device 65 disposed on at least one of the first and second membranes is omitted here in FIG. 2A for the sake of simplicity.

A dotted line in FIG. 2A shows a position of the actuator in case the piezoelectric device on the first membrane 60a is inclined. Unlike in the conventional actuator where the inclination angle of the mirror (disposed on the connecting part but not shown in FIG. 2A) is determined only by the inclination angle θ of the membrane, the inclination angle θ' of the mirror can be adjusted by controlling θ, d, b, c, h, b', etc. in the actuator in accordance with the present invention. Therefore, the inclination angle θ' of the mirror can have a greater value than the inclination angle θ of the membrane and, thus, can be controlled to be varied within a broader range.

Figure 2B:
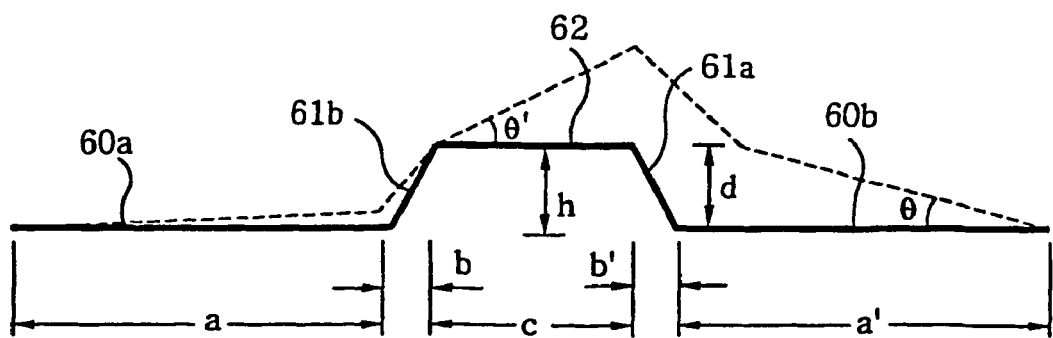

Referring to FIG. 2B, a dotted line shows a position of the actuator in case the piezoelectric device on the second membrane 60b is inclined.

By using the above-described technical concept of the present invention, an optical switching device using a closed loop shaped micro actuator can be realized as will be described hereinafter.

An optical switching device in accordance with present invention includes a mirror, a first actuator for adjusting the tilt angle of the mirror on the X axis and a second actuator for adjusting the tilt angles of the first actuator and thus the mirror on the Y axis. Here, the first and second actuators comprise a closed loop realized in form of a circle. Alternatively, the closed loop may be implemented in form of a polygon.

The first actuator includes a first membrane, a second membrane, a piezoelectric device formed on at least one of the membranes and connecting parts coupled between the membranes. Further, each of the connecting parts has two elastic bodies, one end of each of which is coupled to one of the membranes, and a connecting member coupled between the two elastic bodies. Here, each of the connecting parts is positioned at the opposite side with respect to each other across the mirror. Further, each of the connecting parts is coupled to the mirror through a transmitting part such that the connecting parts can adjust the tilt angle of the mirror on the X axis.

Meanwhile, the second actuator includes a third membrane, a fourth membrane, a piezoelectric device formed on at least one of the membranes and connecting parts coupled between the membranes. Further, each of the connecting parts has two elastic bodies, one end of each of which is coupled to one of the membranes, and a connecting member coupled between the two elastic bodies. Here, each of the connecting parts is positioned at the opposite side with respect to each other across the mirror. Further, the connecting parts are positioned such that a virtual line drawn between the connecting parts of the first actuator lies at right angles to that drawn between the connecting parts of the second actuator.

In the following, preferred embodiments of the present invention will be described in detail.

Figure 3:
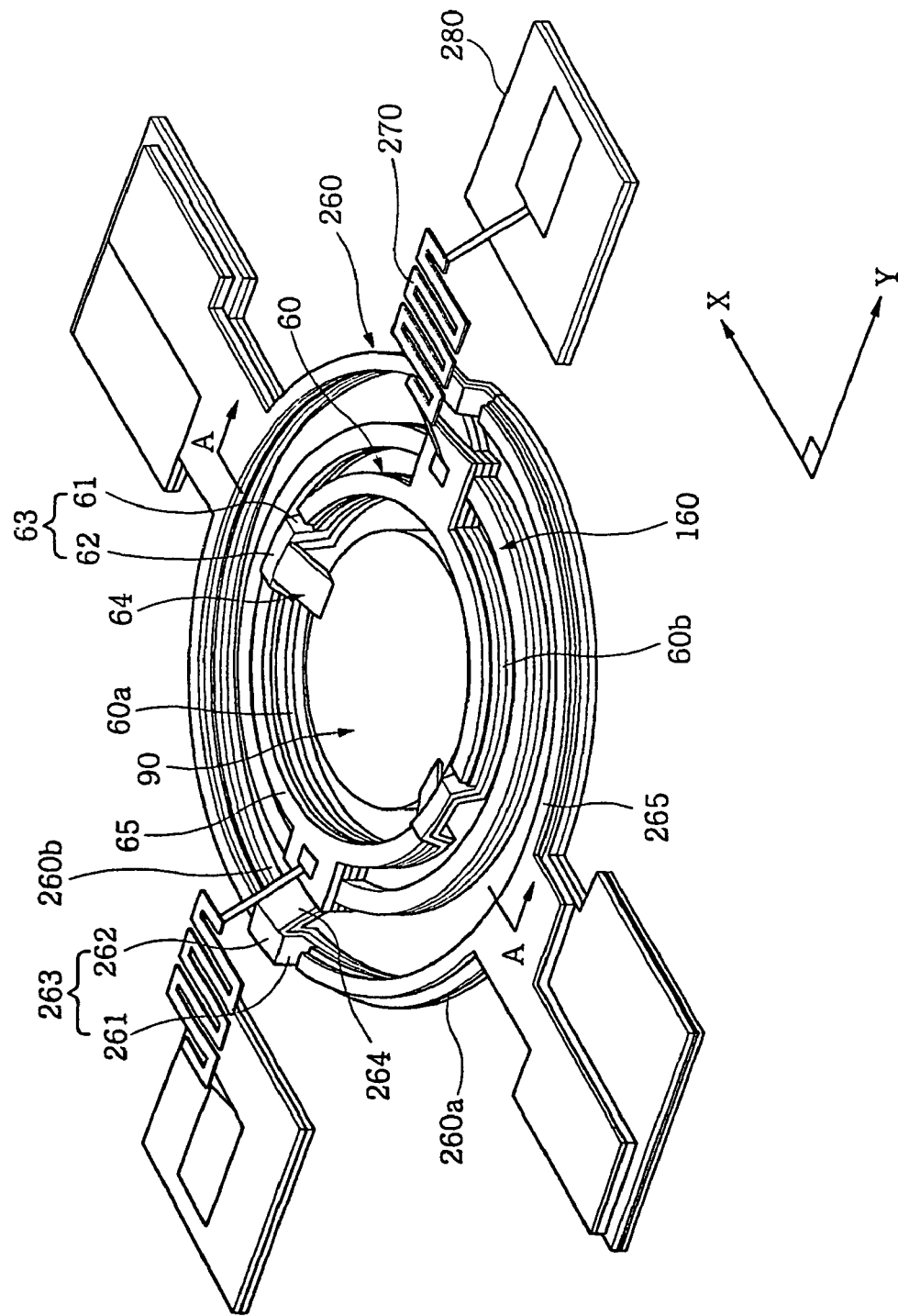
FIG. 3 depicts a perspective view of an optical switching device having an actuator in accordance with a preferred embodiment of the present invention.

FIG. 3 illustrates an optical switching device having a micro piezoelectric actuator in accordance with a preferred embodiment of the present invention. The optical switching device includes a mirror 90, a first actuator 60 for adjusting the tilt angle of the mirror 90 on the X axis and a second actuator 260 for adjusting the tilt angle of the mirror 90 on the Y axis. Here, each of the first actuator 60 and the second actuator 260 comprises a closed loop. Although the actuators are described to have circular shapes in FIG. 3, the actuators also can be configured to have polygonal shapes.

As shown in FIG. 3, the connecting parts 63 and 263 are positioned such that a virtual line drawn between the connecting parts 263 lies at right angles to that drawn between the connecting parts 63.

The first actuator 60 includes a first membrane 60a, a second membrane 60b, a piezoelectric device 65 formed on at least one of the membranes 60a and 60b and connecting parts 63 formed between the membranes 60a and 60b. Further, the second actuator 260 includes a third membrane 260a, a fourth membrane 260b, a piezoelectric device 265 formed on at least one of the membranes 260a and 260b and connecting parts 263 formed between the membranes 260a and 260b.

In the meantime, each of the connecting parts 63 has two inclines 61, each of which is connected to the first membrane 60a or the second membrane 60b, and a connecting member 62 coupled between the two inclines 61. Further, each of the connecting parts 263 has two inclines 261, each of which is connected to the third membrane 260a or the fourth membrane 260b, and a connecting member 262 coupled between the two inclines 261. Herein, each of the inclines and the connecting members is preferably made of an elastic body in order to increase the flexibility in tilting of the mirror.

The second actuator 260 is coupled to gimbals 160 through a transmitting part 264. Further, a hinge (not illustrated) may be added between the connecting member 62 and the gimbals 160 and/or between the connecting member 262 and a pad 280 in order to prevent the gimbals 160 from make a displacement while the mirror being tilted. That is, the hinge takes a part in making the optical switching device tilt on the X axis (or the Y axis) more independently from the tilting on the Y axis or (the X axis). However, the gimbals 160 can be used without the hinge. Furthermore, the first actuator 60 may be coupled to the second actuator 260 through only the transmitting part 264 without the gimbals 160.

Although, in FIG. 3, each of the actuators 60 and 260 is described to have two connecting parts, it can be also configured to have only one connecting part.

Meanwhile, the angle formed where each of the inclines and each of the membranes cross is equal to or larger than 90°. Further, the incline is preferably coupled to the membrane such that they can perform a circular movement together.

Each of the piezoelectric devices 65 and 265 includes a top electrode, a bottom electrode and a piezoelectric material positioned between the top and bottom electrodes. As described above, PZT, $PbTiO_3$, PLZT, $PbZrO_3$, PLT, PNZT, $LiNbO_3$ or $LiTaO_3$ can be used as the piezoelectric material.

The top and bottom electrodes are coupled to a driving circuit (not illustrated) through an electrode bride 270. As shown in FIG. 3, the electrode bride 270 is preferably configured to have a zigzag shape, which plays a role in buffering stress produced when the electrode bride is tilted according to the tilting of the mirror.

The top and the bottom electrodes are made of a conductive material. The top electrode is composed of, e.g., Al, Ru, Au, Ag, or $RuO_2$, etc. The bottom electrode is formed of, e.g., Ru or an alloy of Ru and Ta, both of which exhibiting a high conductivity.

As illustrated in FIG. 3, the mirror 90 is positioned inside the first actuator 60. The mirror 90 is coupled to each of the connecting parts 63 through a transmitting part 64, which plays a role in adjusting the tilt angle of the mirror 90 on the X axis. Here, each of the connecting parts 63 is positioned at the opposite side with respect to each other across the mirror 90. Further, as described above, the gimbals 160 is positioned between the first actuator 60 and the second actuator 260, such that the first actuator 60 is coupled to the second actuator 260 via the transmitting part 264 coupled to the gimbals 160.

The optical switching device in accordance with the present invention adjusts the direction of lights refracted on the mirror as follows.

First, a driving signal is transmitted through the electrode bridge 270 from a driving circuit (not illustrated) to the top/bottom electrodes of the piezoelectric device 65 formed on the first actuator 60. The driving signal exerts the piezoelectric device 65 to be constricted or expanded such that the connecting parts 63, i.e., the connecting members 62 and the inclines 61 change its inclination angles with respect to the membranes 60a and 60b. The change of the inclination angles causes the mirror 90 to change its tilt angle on the X axis through the transmission parts 64.

In the meanwhile, another driving signal is transmitted through the electrode bridge 270 from the driving circuit to the top/bottom electrodes of the piezoelectric device 265 formed on the second actuator 260. Likewise, the driving signal exerts the piezoelectric device 265 to be constricted or expanded such that the connecting parts 263, i.e., the connecting members 262 and the inclines 261 change its inclination angles with respect to the membranes 260a and 260b. The change of the inclination angles causes the first actuator 60 to change its inclination angle on the Y axis through the transmission parts 264, which further causes the mirror 90 to change its tilt angle on the Y axis.

Here, each of the tilting movements on the X and Y axes does not affect each other. Accordingly, the optical switching device of the present invention can control the tilting of the mirror on the X axis (or the Y axis) without affecting the tilting on the Y axis (or the X axis).

The optical switching device of the present invention may have a circuit for correcting the tilting angle of the mirror. A correcting mechanism used by the circuit is realized by using, e.g., an optical method, a piezo-resistive method or a piezo-capacitive method.

In the present invention, the mirror 90, and the first and second actuators 60 and 260 are constructed so that they float on the driving substrate. Therefore, in the fabrication process of the optical switching device, there is no necessity for making a sacrificial layer thicker, which will be described later.

Figure 4A:
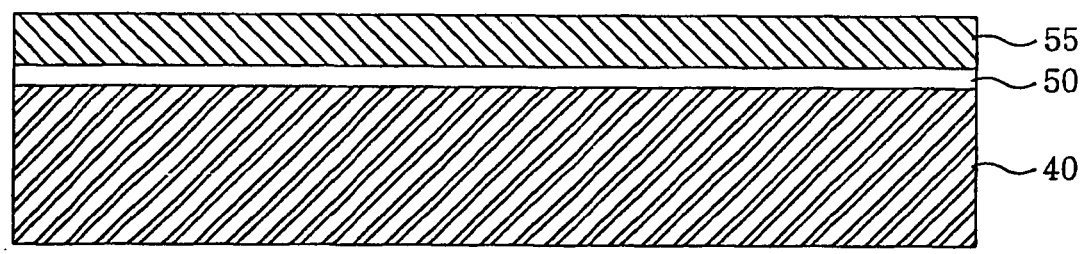
FIGS. 4A to 4N illustrate a process for fabricating the optical switching device in accordance with the preferred embodiment of the present invention.
Figure 4B:
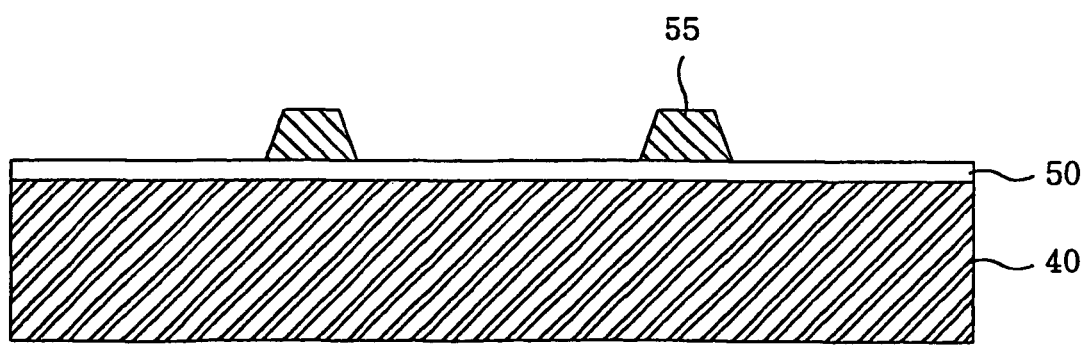
Figure 4C:
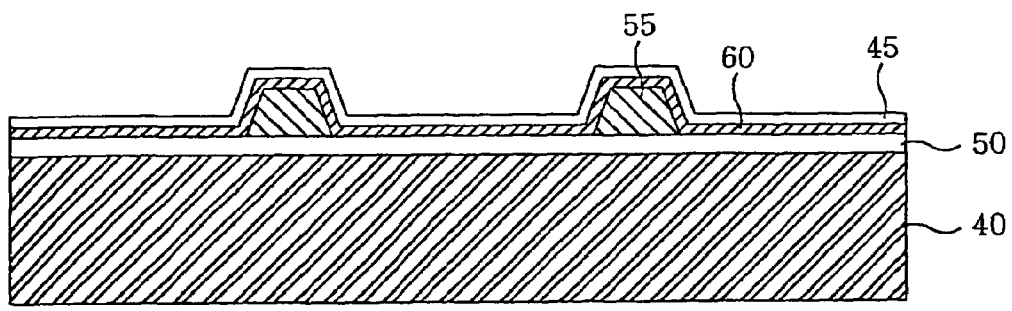
Figure 4D:
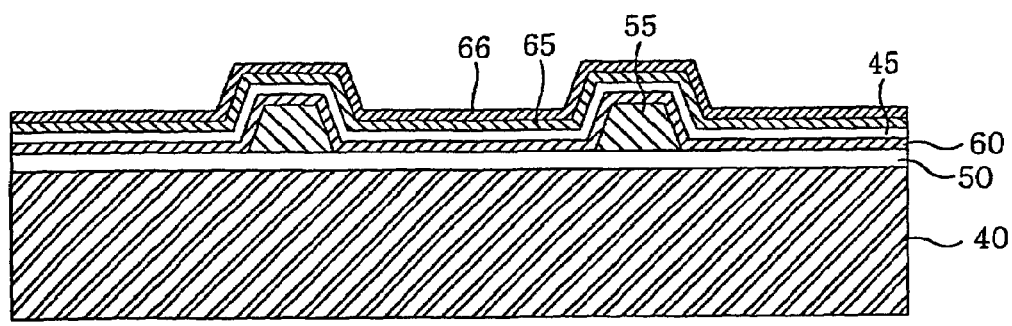
Figure 4E:
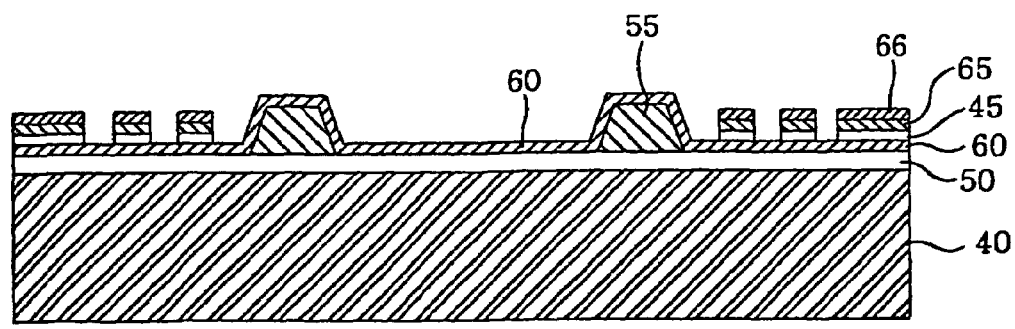
Figure 4F:
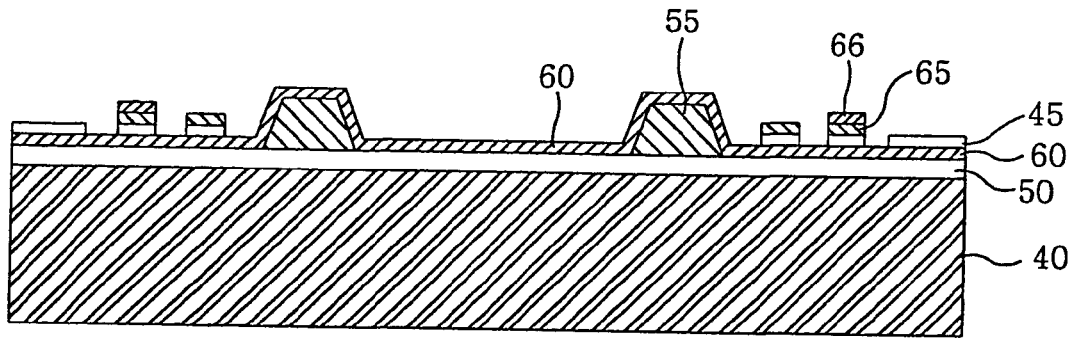
Figure 4G:
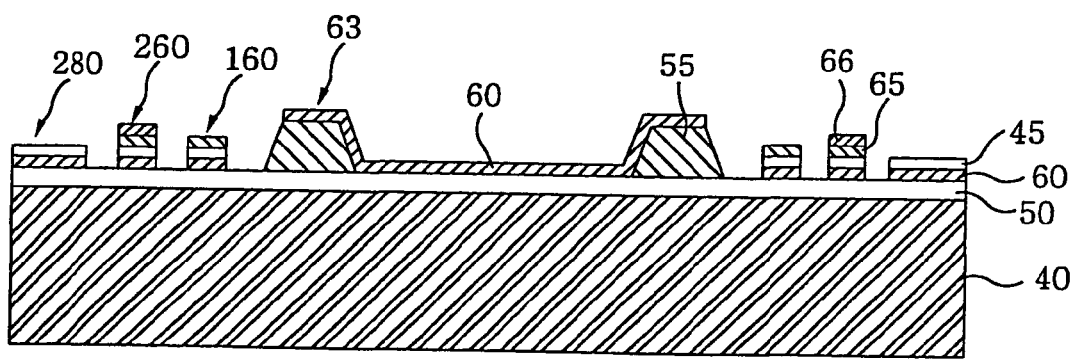
Figure 4H:
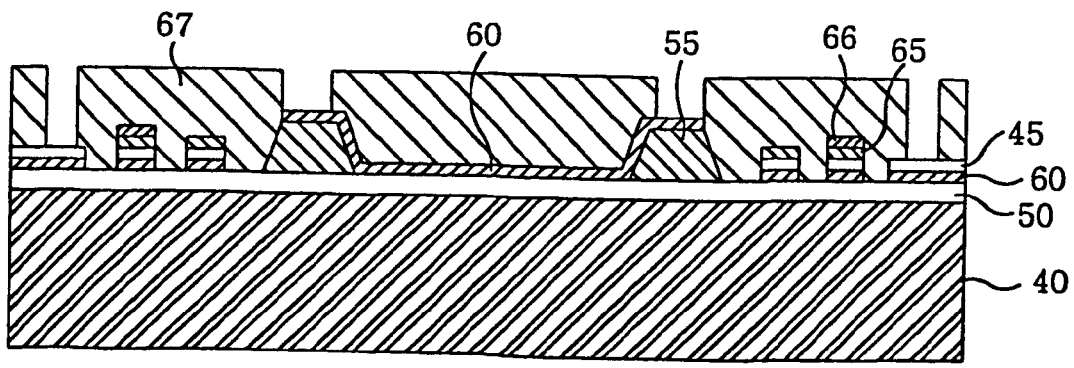
Figure 4I:
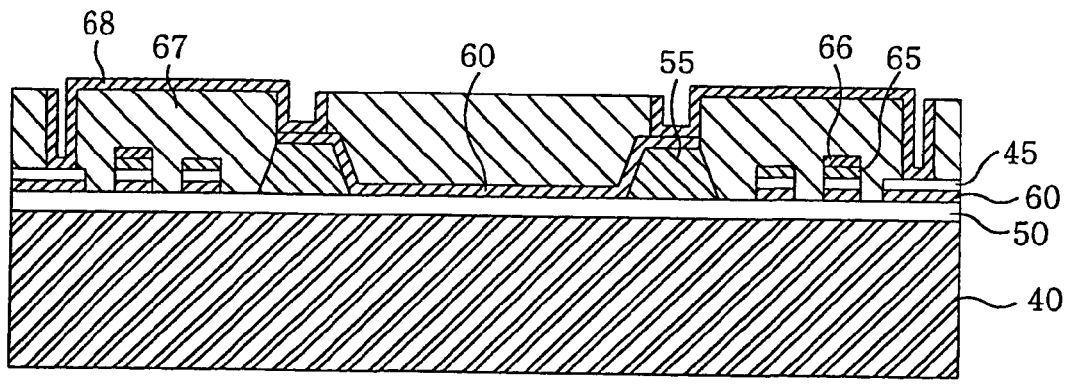
Figure 4J:
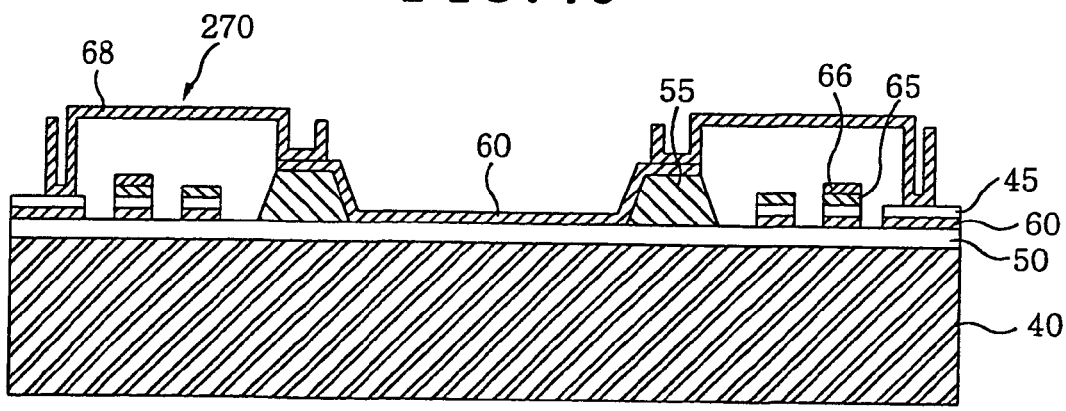
Figure 4K:
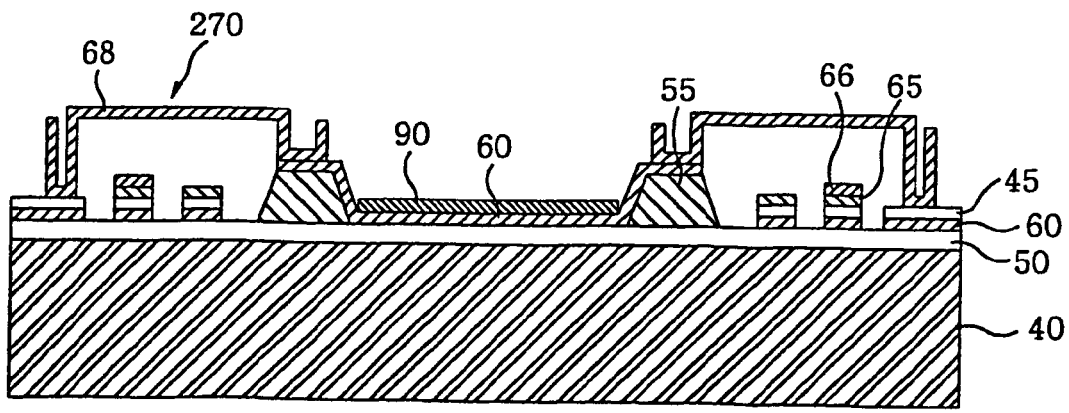
Figure 4L:
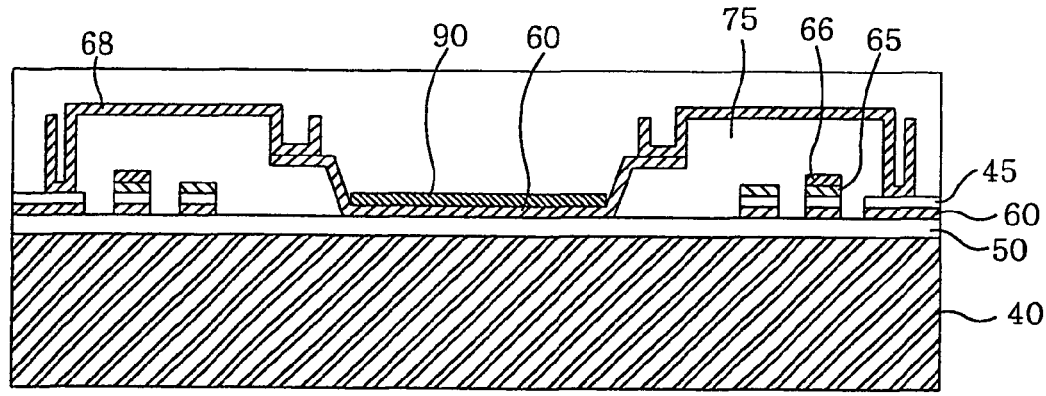
Figure 4M:
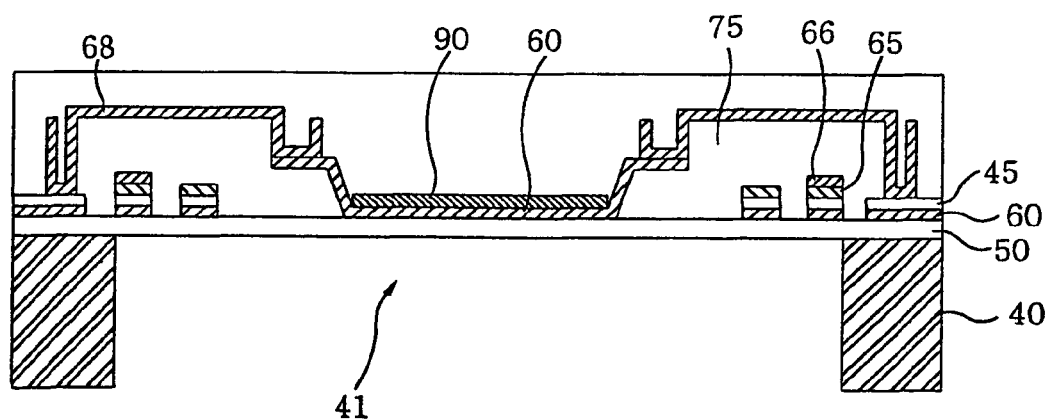
Figure 4N:
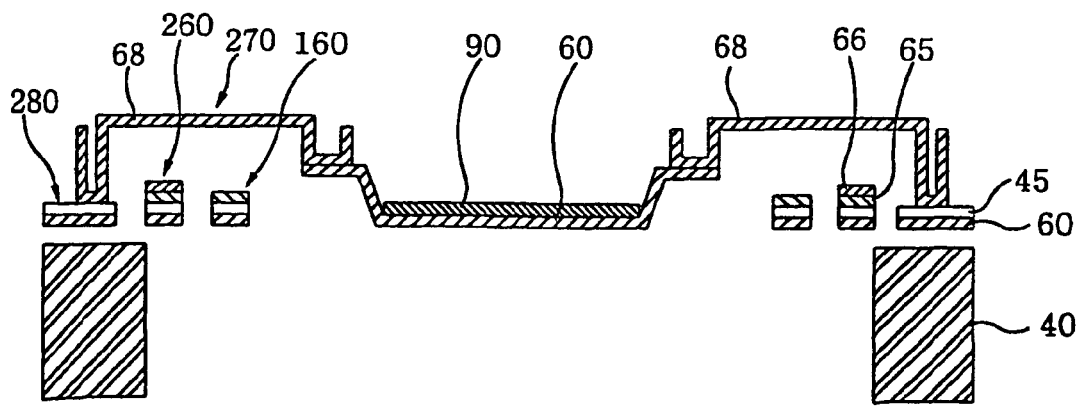

FIGS. 4A to 4N offer sequentially processes for fabricating the optical switching device including the micro piezoelectric actuator in accordance with the preferred embodiment of the present invention.

First, as shown in FIG. 4A, a protection layer 50 is deposited on a driving substrate 40. The protection layer 50 prevents the driving substrate 40 from being damaged by succeeding processes or prevents the upper layers from being etched when the driving substrate 40 being etched. The protection layer 50 contains, e.g., $SiO_2$ or SiNx. And then, a sacrificial layer 55 is deposited on the upper surface of the protection layer 50, e.g., by using CVD (chemical vapor deposition). The sacrificial layer 55 usually contains silicon. Further, the layer structure shown in FIG. 4A may be constructed by using a ready-made SOI (silicon on insulator wafer).

Subsequently, as shown in FIG. 4B, on the first sacrificial layer 55 are patterned to form columns. On the protection layer 50 and the columns 55, as shown in FIGS. 4C and 4D, a membrane layer 60 having substantial stiffness, e.g., an SiNx layer, a bottom electrode layer 45, e.g., a platinum layer, and a piezoelectric material layer 65 are deposited in order. Here, the piezoelectric material layer contains, e.g., PZT, $PbTiO_3$, PLZT, $PbZrO_3$, PLT, PNZT, $LiNbO_3$ or $LiTaO_3$. And then, a top electrode layer 66, e.g., a platinum layer is deposited on the piezoelectric material layer 65. The top and bottom electrode layers 45 and 66 and the piezoelectric material layer 65 comprise a piezoelectric device layer. Further, in the above-described process, other material such as gold may be used instead of platinum.

Next, as shown in FIGS. 4E and 4F, the piezoelectric device layer is etched such that only a desired part of the piezoelectric device layer remains. Also, as shown in FIG. 4G, the membrane layer 60 is etched such that a part thereof is removed. Thus, the first and second actuators 60 and 260 and the gimbals 160 are formed on the protection layer 50.

And then, as shown in FIG. 4H, a PR (photo resist) layer 67 is applied on the structure shown in FIG. 4G. After the PR 67 layer is applied thereon, places are developed where electrode bridges are to be coupled to the first actuator and a pad coupled to a driving circuit. Subsequently, metal 68 is deposited thereon and patterned by using PR, such that electrode bridges are formed as shown in FIG. 4I. And then, the first sacrificial layer 55 and the PR 67 are removed through etching by using, e.g., $XeF_2$ (FIG. 4J). Although, the electrode bridges are described to be coupled to the first actuator in FIGS. 4H to 4J, the electrode bridges may be coupled to the second actuator or the gimbals.

Subsequently, as depicted in FIG. 4K, a mirror 90 is formed on the membrane layer 60. The mirror 90 may be formed by patterning a mirror layer deposited on the whole upper surface of the membrane layer 60, or by depositing a mirror after applying a certain layer on the area except where the mirror to be formed.

Although the formations of the electrode bridges 68 and the mirror 90 are sequentially performed in FIGS. 4H to 4K, the electrode brides 68 and the mirror 90 may be formed simultaneously.

Next, as shown in FIG. 4L, a passivation layer 75 is deposited on the structure described in FIG. 4K. After that, a part of the driving substrate 40 is selectively removed such that the underlying surface of the protection layer 50 is exposed through an opening 41 (FIG. 4M). Finally, as shown in FIG. 4N, the passivation layer 75 and the protection layer 50 are etched to be removed.

As described with reference to FIGS. 4M and 4N, the optical switching device is constructed such that there exists no structure under the mirror 90 and the membrane layer 60, which makes the mirror move without limitation. Further, this lessens the necessity to make the sacrificial layer thicker.

FIG. 5 depicts an optical switching device including a micro piezoelectric actuator in accordance with another preferred embodiment of the present invention.

Referring to FIG. 5, the optical switching device includes a mirror 90, a first actuator 60 for adjusting the tilt angle of the mirror 90 on the X axis and a second actuator 260 for adjusting the tilt angles of the first actuator 60 and thus the mirror 90 on the Y axis. Here, the first and second actuators 60 and 260 comprise a closed loop. In FIG. 5, the closed loop is realized in form of a circle. Alternatively, the closed loop may be implemented in form of a polygon.

The first actuator 60 includes a first membrane 60a, a second membrane 60b, a piezoelectric device 65 formed on at least one of the membranes 60a and 60b and connecting parts 22 coupled between the membranes 60a and 60b. Further, each of the connecting parts 22 has two zigzag-shaped elastic bodies 22b, one end of each of which is coupled to the membrane 60a or 60b, and a connecting member 22a coupled between the two elastic bodies 22b. Here, each of the connecting parts 22 is positioned at the opposite side with respect to each other across the mirror 90. Further, each of the connecting parts 22 is coupled to the mirror 90 through a transmitting part 30 such that the connecting parts 22 can adjust the tilt angle of the mirror 90 on the X axis.

Meanwhile, the second actuator 260 includes a third membrane 260a, a fourth membrane 260b, a piezoelectric device 265 formed on at least one of the membranes 260a and 260b and connecting parts 42 coupled between the membranes 260a and 260b. Further, each of the connecting parts 42 has two zigzag-shaped elastic bodies 42b, one end of each of which is coupled to the membrane 260a or 260b, and a connecting member 42a coupled between the two elastic bodies 42b. Here, each of the connecting parts 42 is positioned at the opposite side with respect to each other across the mirror 90. Further, the connecting parts 42 are positioned such that a virtual line drawn between the connecting parts 42 lies at right angles to that drawn between the connecting parts 22.

Although, in FIG. 5, each of the actuators 60 and 260 is described to have two connecting parts, it can be also configured to have only one connecting part.

Further, each of the connecting parts 42 is coupled to the gimbals 160 through a transmitting part 52 such that the connecting parts 42 can adjust the inclination angle of the first actuator 60 on the Y axis, which causes the tilt angle of the mirror 90 on the Y axis. And also, as described with reference to FIG. 3, a hinge may be added between the connecting member 22a and the gimbals 160 and/or between the connecting member 42a and a pad 280. Further, the first actuator 60 may be coupled to the second actuator 26 through only the transmitting part 52 without the gimbals 160.

Each of the piezoelectric devices 65 and 265 includes a top electrode, a bottom electrode and a piezoelectric material positioned between the top and bottom electrodes. As described above, PZT, $PbTiO_3$, PLZT, $PbZrO_3$, PLT, PNZT, $LiNbO_3$ or $LiTaO_3$ can be used as the piezoelectric material. The top and bottom electrodes are coupled to a driving circuit (not illustrated) through an electrode bride 270. As shown in FIG. 5, the electrode bride 270 is configured to have a zigzag shape, which plays a role in buffering stress produced when the electrode bride is tilted according to the tilting of the mirror.

In the following, the operation of the optical switching device including the actuator in accordance with the present invention will be described in detail.

FIGS. 6A and 6B charts the operation of the micro piezoelectric actuator in accordance with present invention. In FIGS. 6A and 6B, it is assumed that, according to the design rule, the dimensions of the actuator are determined based on those of the mirror. Also, the lengths a and a' of first and second membranes and a variation height d are assumed to be fixed.

For instance, as shown in FIG. 6A, when a left piezoelectric device is contracted according to a driving signal fed into the actuator, a first membrane 60a is transformed by a height d and, simultaneously, a connecting part including elastic bodies 22b and a connecting member 22a is transformed. On the other hand, a second membrane 60b having a right piezoelectric device thereon is hardly transformed. Accordingly, the actuator is transformed with the inclination angle of θ, which is represented by Equation (1). Thus, a mirror coupled to the connecting member 22a of the actuator through a transmitting part is tilted by the inclination angle of θ.

$$\theta = \tan^{-1}\left(\frac{d}{b}\right)$$  Equation (1)

Referring to Equation (1), since the variation height d is determined according to the design rule, the inclination angle of the actuator can be varied by changing the length b of the connecting part. That is, as the length b is decreased, the inclination angle θ is increased.

FIG. 6B shows the variation of the actuator when the right piezoelectric device but not the left one is contracted according to a driving signal fed into the actuator. The calculation of the inclination angle of the actuator, which is described above with reference to FIG. 6A, can be applied to the case of FIG. 6B.

FIGS. 7A to 7L offer sequentially processes for fabricating the optical switching device including the micro piezoelectric actuator in accordance with the another preferred embodiment of the present invention.

Figure 7A:
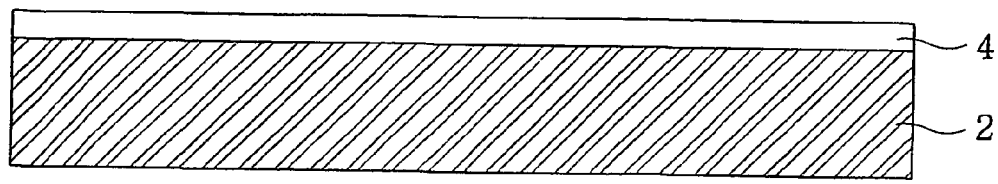

First, as shown in FIG. 7A, a driving substrate 2 having a driving circuit for generating a driving signal is formed on a semiconductor substrate (not illustrated). Here, the driving substrate 2 may be configured in a hybrid structure where the driving circuit is implemented on the surface of the driving substrate 2. And then, on the upper surface of the driving substrate 2, a protection layer 4 containing, e.g., SiO$_2$ or SiNx is deposited. The protection layer 4 prevents the driving substrate 2 from being damaged in the succeeding processes or prevents the upper layers from being etched when the driving substrate 2 being etched. As described with reference to FIG. 4A, the layer structure shown in FIG. 7A may be constructed by using a ready-made SOI (silicon on insulator wafer).

Figure 7B:
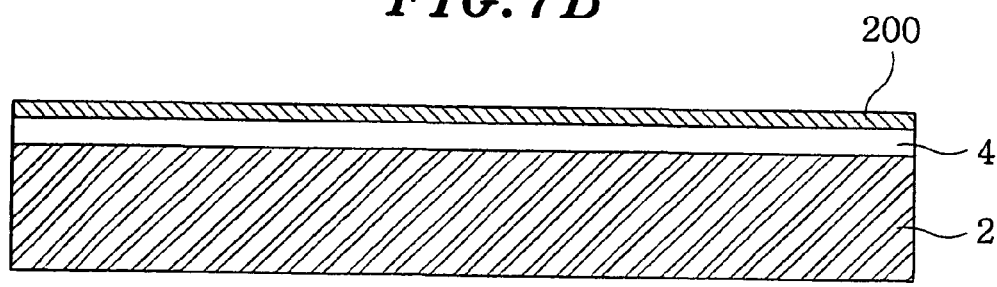
Figure 7C:
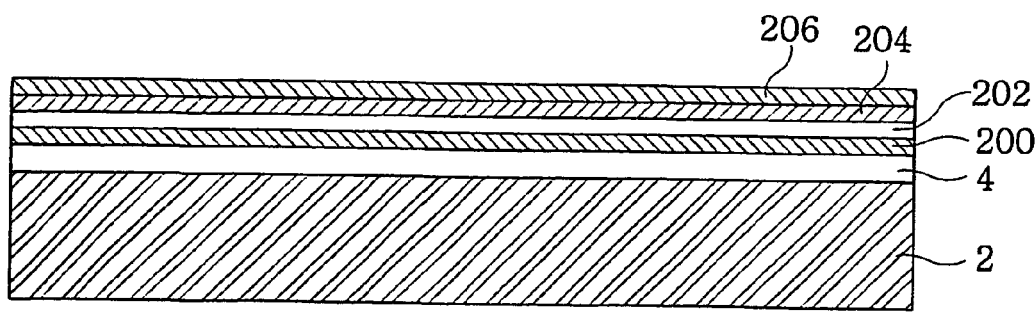

Next, as shown in FIGS. 7B and 7C, a membrane layer 200 having substantial stiffness is deposited on the protection layer 4. The membrane layer 200 contains, e.g., SiO$_2$ or SiNx. In the later process, the membrane layer 200 is etched to have membranes and connecting parts of an actuator. And then, on the membrane layer 200, a piezoelectric device layer including a bottom electrode layer 202, a piezoelectric material layer 204 and a top electrode layer 206 is applied. In this case, the bottom and top electrode layers 202 and 206 are deposited by using metal such as Pt. The piezoelectric material layer 204 is deposited by using, e.g., PZT, PbTiO$_3$, PLZT, PbZrO$_3$, PLT, PNZT, LiNbO$_3$ or LiTaO$_3$. In the above-described process, other material such as gold may be used instead of platinum.

Figure 7D:
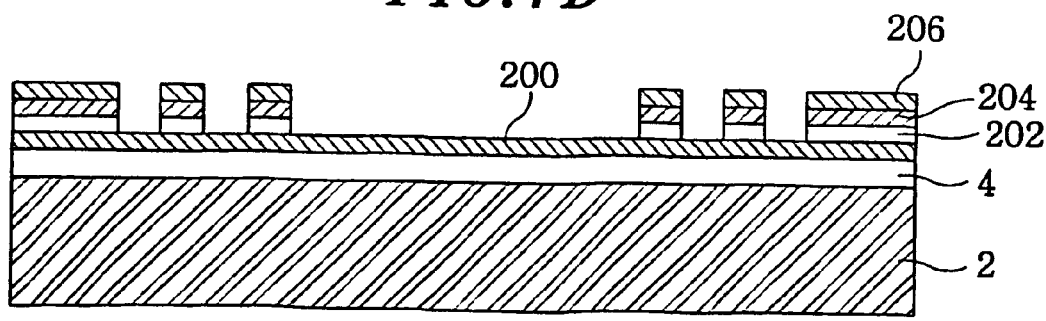
Figure 7E:
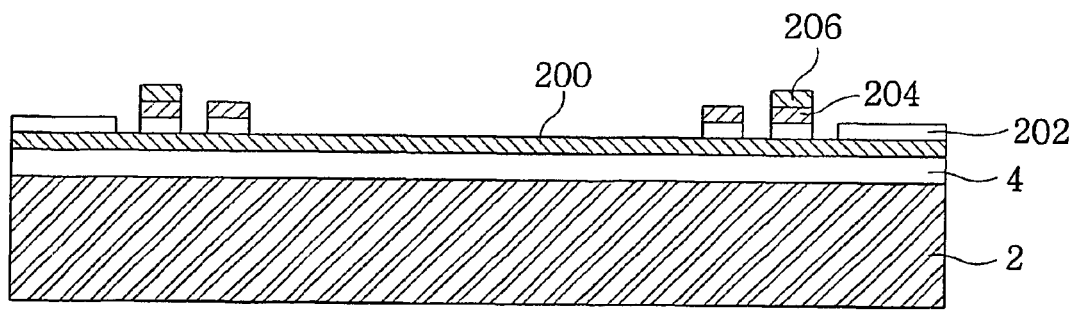
Figure 7F:
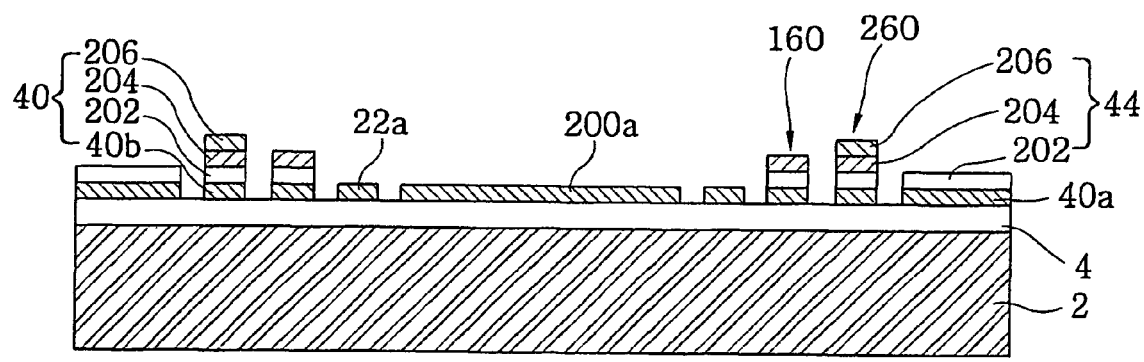

Subsequently, as shown in FIGS. 7D and 7E, the piezoelectric device layer is etched such that only a desired part of the piezoelectric device layer remains. Also, as shown in FIG. 7F, the layer 200 is patterned such that membranes of a first actuator and a second actuator 260 are formed therein. In this case, elastic bodies coupled to the membranes and connecting parts 22a are also formed. Further, a gimbals 160 is formed to connect the first actuator to the second actuator. Further, transmitting parts are formed to connect the first actuator to a mirror or connect the second actuator to the gimbals. As described with reference to FIG. 5, the gimbals is optional, such that the first actuator can be coupled to the second actuator through only the transmitting parts. As shown in FIG. 7F, a mirror supporting region 200a can be further constructed while the membrane layer 200 being etched.

Figure 7G:
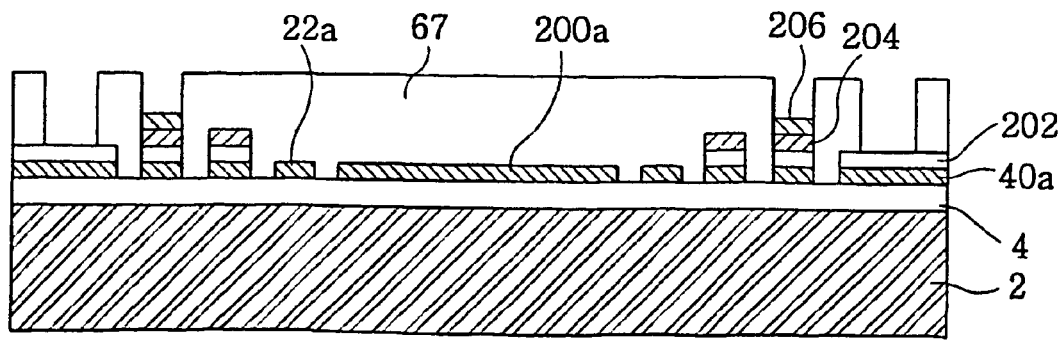
Figure 7H:
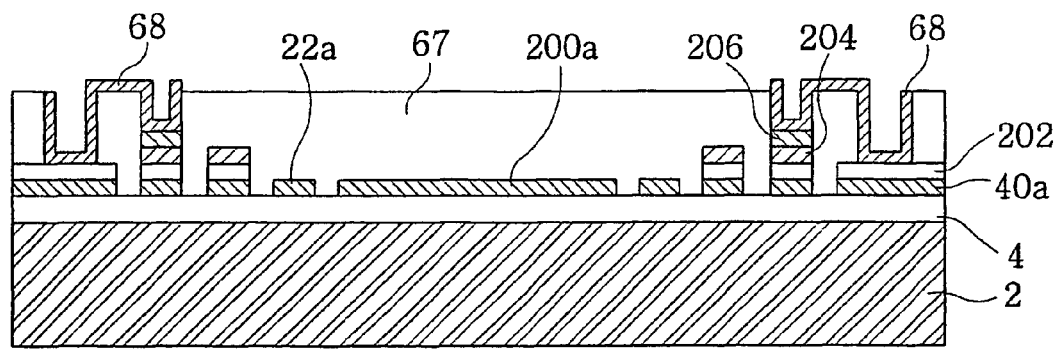
Figure 7I:
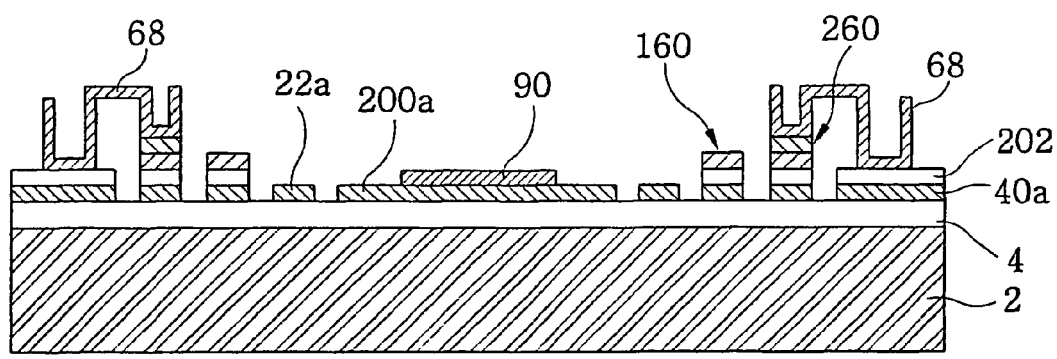

And then, as shown in FIG. 7G, a PR (photo resist) layer 67 is applied on the structure shown in FIG. 7F. After the PR 67 is applied thereon, places are developed where electrode bridges are to be coupled to the second actuator and a pad coupled to a driving circuit. Subsequently, metal 68 is deposited thereon and patterned by using PR, such that electrode bridges are formed as shown in FIG. 7H. And then, the PR 67 is removed through etching by using, e.g., XeF$_2$ (FIG. 7I). Although the electrode bridges are described to be coupled to the second actuator in FIGS. 7G to 7I, the electrode bridges may be coupled to the first actuator or the gimbals.

Subsequently, as depicted in FIG. 7I, a mirror 90 is formed on the mirror supporting region 200a. The mirror 90 may be formed by patterning a mirror layer deposited on the whole upper surface of the mirror supporting region 200a, or by depositing a mirror after applying a certain layer on the area except where the mirror to be formed.

Although the formations of the electrode bridges 68 and the mirror 90 are sequentially performed in FIGS. 7G to 7I, the electrode brides 68 and the mirror 90 may be formed simultaneously.

Figure 7J:
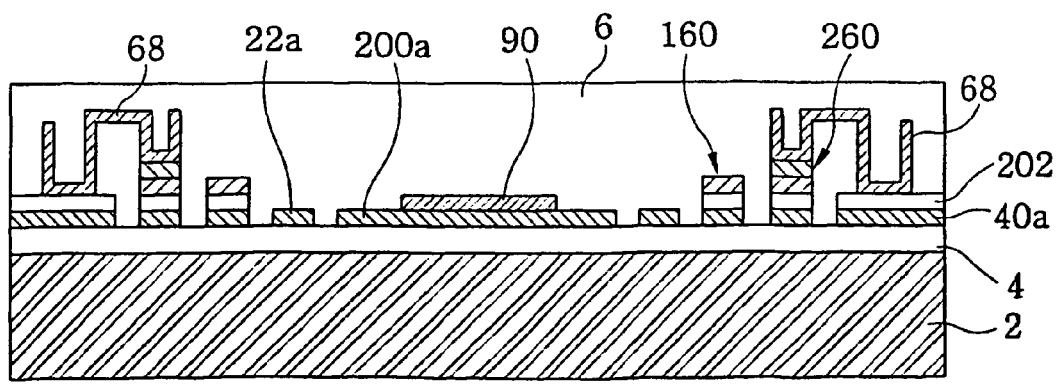
Figure 7K:
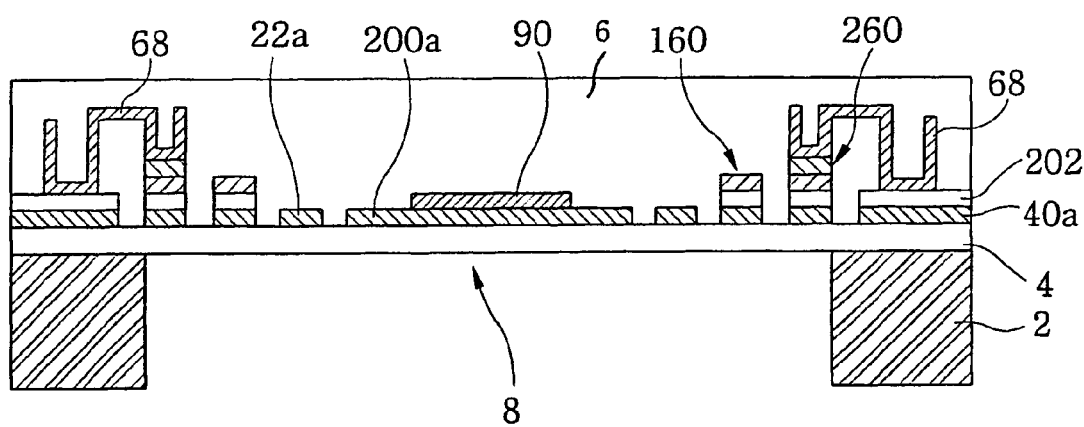

Subsequently, as shown in FIG. 7J, a passivation layer 6 is applied on the structure described in FIG. 7I. After that, a part of the driving substrate 2 is selectively removed such that the underlying surface of the protection layer 4 is exposed through an opening 8 (FIG. 7K).

Figure 7L:
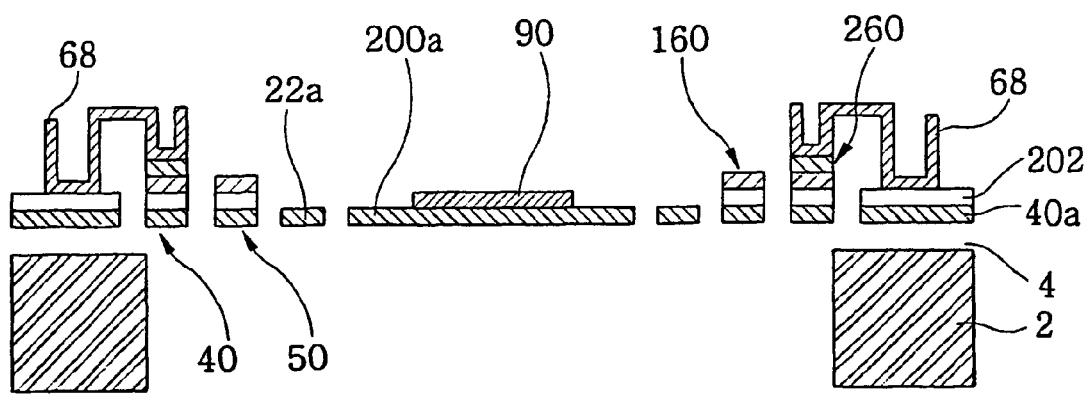

Finally, as shown in FIG. 7L, the passivation layer 6 and the protection layer 4 are removed, such that the fabrication process of the optical switching device including the piezoelectric actuator in accordance with the present invention is completed.

As described above, the micro actuator of the present invention includes connection parts having elastic bodies and a connecting member positioned between two membranes such that the membranes and the connecting parts become coplanar. In this way, a fabrication process of a sacrificial layer for supporting connection parts can be omitted from the whole process for fabricating the actuator, which makes the whole process simpler.

In the present invention, while the piezoelectric actuator having the elastic bodies and the connecting members is applied to the optical switching device for adjusting the inclination angle of the mirror therein, the same may be applied to other MEMS devices such as an optical scanner, an optical attenuator, an optical cross connect, a telescope, a micro array, a micro motor, etc.

Further, the optical switching device of the present invention may be implemented in an M×N array of optical switching devices. That is, each of the M×N optical switching devices can be fabricated according to the above description of the present invention. In this case, an actuator of the optical switching device is coupled to a driving circuit thereof through a conductive material.

While the invention has been shown and described with respect to the preferred embodiments, it will be understood by those skilled in the art that various changes and modifications may be made without departing from the spirit and scope of the invention as defined in the following claims.

What is claimed is:

1. An optical switching device comprising:
    a first actuator including a first membrane, a second membrane, a piezoelectric device formed on at least one of the first and second membranes, a first connecting part and a second connecting part, wherein the first connecting part includes a first elastic body coupled to the first membrane, a second elastic body coupled to the second membrane and a first connecting member coupled between the first and second elastic bodies, and the second connecting part includes a third elastic body coupled to the first membrane, a fourth elastic body coupled to the second membrane and a second connecting member coupled between the third and fourth elastic bodies;
    a second actuator including a third membrane, a fourth membrane, a piezoelectric device formed on at least one of the third and fourth membranes, a third connecting part and a fourth connecting part, wherein the third connecting part includes a fifth elastic body coupled to the third membrane, a sixth elastic body coupled to the fourth membrane and a third connecting member coupled between the fifth and sixth elastic bodies, and the fourth connecting part includes a seventh elastic body coupled to the third membrane, a eighth elastic body coupled to the fourth membrane and a fourth connecting member coupled between the seventh and eighth elastic bodies; and
    a mirror positioned inside the first actuator, wherein the mirror is coupled to the first actuator through a first transmitting part and the first actuator is coupled to the second actuator through a second transmitting part.

2. The optical switching device of claim 1, wherein an angle formed where each of the elastic bodies and each of the membranes cross is equal to or larger than 90°, and an angle formed where each of the elastic bodies and each of the connecting members cross is equal to or larger than 90°.

3. The optical switching device of claim 1, wherein each of the elastic bodies has a shape of zigzag.

4. The optical switching device of claim 1, wherein each of the micro actuators has a shape of a circle or a polygon.

5. The optical switching device of claim 1, wherein the piezoelectric device includes a bottom electrode, a piezoelectric material and a top electrode, the bottom and top electrodes being coupled to a driving circuit through an electrode bridge.

6. The optical switching device of claim 5, wherein the piezoelectric material contains PZT, PbTiO3, PLZT, PbZrO3, PLT, PNZT, LiNbO3 or LiTaO3, the bottom electrode contains gold, platinum or platinum-tantalum, and the top electrode contains RuO2, aluminum, platinum, gold or silver.

7. The optical switching device of claim 5, wherein the electrode bridge has a shape of zigzag.

8. The optical switching device of claim 1, wherein, on the condition that the center of the mirror is an origin of the X-Y coordinates, the first and second connecting parts are positioned on the X axis and the third and fourth connecting parts are positioned on the Y axis, a virtual line drawn between the first and second connecting parts lying at right angles to that drawn between the third and fourth connecting parts.

9. The optical switching device of claim 1, wherein the first and second actuators and the mirror float on the driving substrate.

10. The optical switching device of claim 1, further comprising:
    a gimbals coupled to the first actuator and coupled to the second actuator through the second transmitting part.

11. The optical switching device of claim 10, further comprising:
    a hinge coupled between the first or second connecting member and the gimbals.

12. The optical switching device of claim 1, further comprising:
    a circuit for correcting the tilting angle of the mirror, wherein the correcting mechanism is realized by using an optical method, a piezo-resistive method or a piezo-capacitive method.

13. An optical switching device array having M×N array of optical switching devices, wherein each of M and N is a positive integer and each of the optical switching devices comprises:
    a first actuator including a first membrane, a second membrane, a piezoelectric device formed on at least one of the first and second membranes, a first connecting part and a second connecting part, wherein the first connecting part includes a first elastic body coupled to the first membrane, a second elastic body coupled to the second membrane and a first connecting member coupled between the first and second elastic bodies, and the second connecting part includes a third elastic body coupled to the first membrane, a fourth elastic body coupled to the second membrane and a second connecting member coupled between the third and fourth elastic bodies;
    a second actuator including a third membrane, a fourth membrane, a piezoelectric device formed on at least one of the third and fourth membranes, a third connecting part and a fourth connecting part, wherein the third connecting part includes a fifth elastic body coupled to the third membrane, a sixth elastic body coupled to the fourth membrane and a third connecting member coupled between the fifth and sixth elastic bodies, and the fourth connecting part includes a seventh elastic body coupled to the third membrane, a eighth elastic body coupled to the fourth membrane and a fourth connecting member coupled between the seventh and eighth elastic bodies; and
    a mirror positioned inside the first actuator, wherein the mirror is coupled to the first actuator through a first transmitting part and the first actuator is coupled to the second actuator through a second transmitting part.

14. The optical switching device array of claim 13, wherein each of the optical switching devices further comprises:
    a driving circuit for generating a driving signal, wherein the driving circuit is coupled to the top or bottom electrode through a conductive material.

15. The optical switching device array of claim 13, wherein each of the optical switching devices further comprises:
    a circuit for correcting the tilting angle of the mirror, wherein the correcting mechanism is realized by using an optical method, a piezo-resistive method or a piezo-capacitive method.

* * * * *